US006462378B1

United States Patent
Kim

(10) Patent No.: US 6,462,378 B1
(45) Date of Patent: Oct. 8, 2002

(54) POWER MOSFET WITH DECREASED BODY RESISTANCE UNDER SOURCE REGION

(75) Inventor: Jong-hwan Kim, Bucheon (KR)

(73) Assignee: Fairchild Korea Semiconductor, Ltd., Kyungki-do (KR)

( * ) Notice: Subject to any disclaimer, the term of this patent is extended or adjusted under 35 U.S.C. 154(b) by 0 days.

(21) Appl. No.: 09/427,541

(22) Filed: Oct. 27, 1999

(30) Foreign Application Priority Data

Jan. 15, 1999 (KR) ................................. 99-981

(51) Int. Cl.[7] ............................................. H01L 29/76
(52) U.S. Cl. ...................................... 257/342; 257/341
(58) Field of Search ................................. 257/341, 342

(56) References Cited

U.S. PATENT DOCUMENTS

| | | | | |
|---|---|---|---|---|
| 4,837,606 A | * | 6/1989 | Goodman et al. | 357/23.4 |
| 4,860,072 A | * | 8/1989 | Zommer | 357/23.8 |
| 5,923,065 A | * | 7/1999 | So et al. | 257/328 |
| 6,043,532 A | * | 3/2000 | Depetro et al. | 257/335 |
| 6,111,278 A | * | 8/2000 | Kim | 257/144 |

* cited by examiner

Primary Examiner—Fetsum Abraham
(74) Attorney, Agent, or Firm—Rothwell, Figg, Ernst & Manbeck

(57) ABSTRACT

A power MOS transistor in which a source region pattern is formed such that the body resistance of a lower portion of a source region is reduced, to thereby suppress turn-on of a parasitic bipolar transistor and equalize the flow of the current. A source region of a first conductivity type includes a first source region loop formed around a source contact without contacting the source contact and a second source region connecting the first source region, contacting the source contact. The first source region is a region from a predetermined region of a lower portion of a gate electrode to the source contact, so that the length of the first source region is shortened. A heavily-doped region of a second conductivity type is symmetrically formed between the first source region and the second source region. Thus, reverse current partially flows to the source electrode via a base region of a lower end of the first source region and the heavily-doped region of the second conductivity type, and the voltage drop is reduced in accordance with the reduction of the length of the first source region to suppress turn-on of the parasitic bipolar transistor. The heavily-doped regions of the second conductivity type are symmetrically formed, to thereby allow the uniform flow of current.

4 Claims, 4 Drawing Sheets

POWER MOSFET WITH DECREASED BODY RESISTANCE UNDER SOURCE REGION

BACKGROUND OF THE INVENTION

1. Field of the Invention

The present invention relates to a power semiconductor device, and more particularly, to a power MOS transistor with decreased body resistance under a source region.

2. Description of the Related Art

A typical power metal oxide semiconductor (MOS) transistor is more advantageous than a bipolar transistor. For instance, the input impedance of a MOS transistor is high, so that it has a high power gain and its gate driving circuit is very simple. Furthermore, the MOS transistor is a unipolar device, so that no time delay occurs due to accumulation or re-combination by source carriers during turn-off. Thus, the power MOS transistor is widely used in switching mode power supplies, lamp ballasts and a motor drive circuits. A double diffused MOS (DMOS) structure using planar diffusion technology is used as the power MOS transistor in such devices.

FIG. 1 is a layout of a typical vertical DMOS transistor.

Referring to FIG. 1, a source contact 30 is formed inside a loop formed by gate electrode 19 on a semiconductor substrate (not shown), and a multiplicity of drain contacts 40 are formed outside the gate electrode 19. A p-type body region 14 is formed in the substrate, such that it is overlapped by the gate electrode 19. An n-type source region loop 15 that is heavily doped and has a predetermined width d is formed in the p-type body region 14. A p-type heavily-doped region 16 is formed inside the n-type source region loop 15. An n-type heavily-doped drain region 18 is formed under the drain contacts 40. The n-type heavily doped drain region 18 is completely surrounded with an n-type heavily-doped sink region 17.

FIG. 2 is a sectional view of the vertical DMOS transistor taken along the line I—I of FIG. 1.

Referring to FIG. 2, an n-type heavily-doped buried layer 11 is formed on a semiconductor substrate 10 and an n-type lightly-doped epitaxial layer 12 is formed on the n-type heavily-doped buried layer 11. An n-type well region 13 is formed in a region of the top of the n-type lightly-doped epitaxial layer 12, and a p-type body region 14 is formed in a predetermined region of the top of the n-type well region 13. An n-type heavily-doped sink region 17 is formed in another region of the n-type well region 13, and the bottom of the n-type heavily-doped sink region 17 overlaps with a region of the top of the n-type heavily doped buried layer 11. A multiplicity of n-type source region loops 15, spaced apart by a predetermined interval, are formed in the p-type body region 14, and the p-type heavily-doped region 16 is formed between the n-type source region loop 15. Also, an n-type heavily-doped drain region 18 is formed in the top of the n-type heavily-doped sink region 17. Meanwhile, parts of the n-type source region loop 15 and the p-type heavily-doped region 16 directly contact a source electrode 21, and the n-type heavily-doped drain region 18 directly contacts a drain electrode 22. The gate electrode 19 is connected to both the n-type source region loop 15 and part of the p-type body region 14 through a gate insulating layer 20 so that a conductive channel is formed under predetermined conditions. The gate, drain, and source electrodes, respectively 19, 21, and 22, are insulated from each other by an insulating layer 23, and an active region is defined by a field oxide layer 24.

When the device operates with a large current and has a low ruggedness, the amount of reverse current is increased, so that turn-on of a parasitic bipolar transistor occurs.

In particular, a large reverse current passes through the p-type body region 14 near the bottom of the n-type source region loops 15 during a reverse recovery operation of switching and passes to the source electrode 21 via the p-type heavily-doped region 16. However, a predetermined resistance component (p-type body resistance component) exists in the p-type body region, 14 of the bottom of the n-type source region loop 15, and a voltage drop occurs due to the reverse current passing through the resistance component. When the voltage drop is large enough to forward-bias a pn junction formed by the p-type body region 14 and the n-type source region loop 15, a parasitic npn bipolar transistor is turned on so that a large amount of current flows from the n-type source region loop 15 to the n-type well region 13. Thus, the device cannot be controlled by the gate voltage, and the device itself may be damaged due to excessive current.

The phenomenon of turn-on of the parasitic bipolar transistor can be suppressed in various ways, typically by reducing the p-type body resistance.

FIG. 3 is a sectional view of a conventional vertical DMOS transistor in which the p-type body resistance is reduced. The same reference numerals as those of FIG. 2 represent the same elements.

As shown in FIG. 3, a p-type heavily-doped region 50 is formed in the p-type body region 14. Thus, the p-type body resistance is lowered, so that the voltage drop due to reverse current is reduced to suppress the turn-on of the parasitic bipolar transistor. But, an additional mask layer is required for forming the p-type heavily-doped region 50, thereby complicating the manufacturing processes.

SUMMARY OF THE INVENTION

It is an object of the present invention to provide a power MOS transistor in which the structure of a source region is changed to suppress turn-on of a parasitic bipolar transistor by reducing the body resistance under the source region.

To achieve the above object, according to the power MOS transistor of the present invention, a drift region of a first conductivity type is formed on a semiconductor substrate, and a body region of a second conductivity type is formed on a predetermined upper region of the drift region. A source region of the first conductivity type including a first source region loop is formed in the body region, adjacent to a channel formation portion of the body region, and, a second source region facing portions of the first source region. Heavily-doped regions of the second conductivity type are formed between the first source region in the body region and the second source region. A drain region of the first conductivity type is formed in a predetermined region of the drift region. An insulating layer is formed between the first source region and the edge of the body region, and a gate electrode is formed over the insulating layer. A source electrode is formed by a source contact exposing the second source region and the heavily-doped region of the second conductivity type, and a drain electrode is formed by a drain contact exposing the drain region.

Preferably, the second source region is formed in the shape of a cross which intersects at the center of the source contact.

Preferably, the heavily-doped regions of the second conductivity type are symmetrically formed at an edge of source contact.

According to the power MOS transistor of the present invention, as a length of the source region adjacent to the channel is reduced, the resistance value under the source region is reduced during flow of the reverse current, and thus turn-on of the parasitic bipolar transistor is suppressed. Also, the p-type heavily-doped regions are symmetrically formed, so that all resistance values are uniform and thus current uniformly flows. Further, as the p-type heavily-doped region becomes larger, the amount of the reverse current is increased, to thereby increase the ruggedness of the device.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENTS

Figure 1:
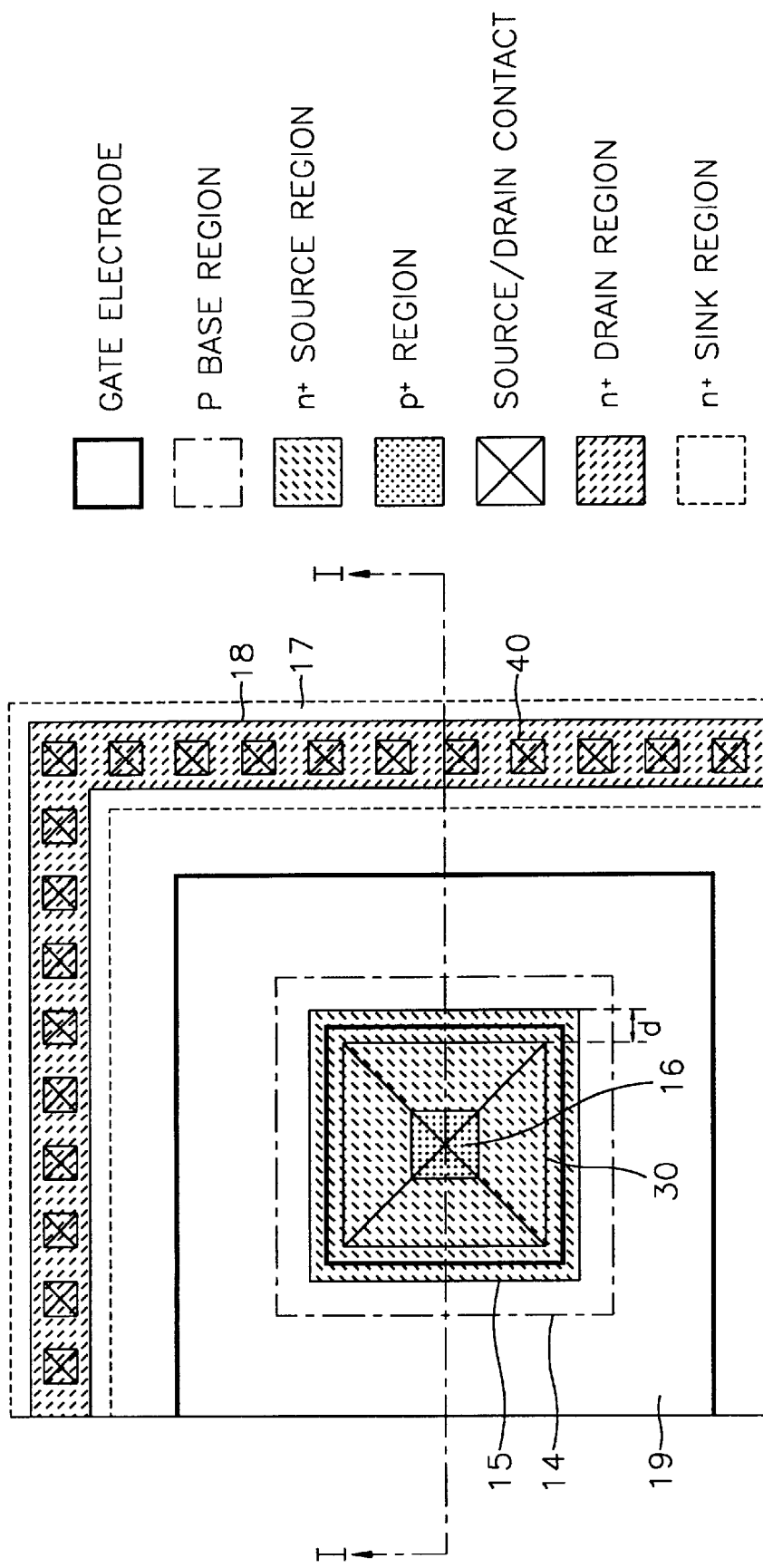
FIG. 1 is a layout of a conventional power MOS transistor.
Figure 2:
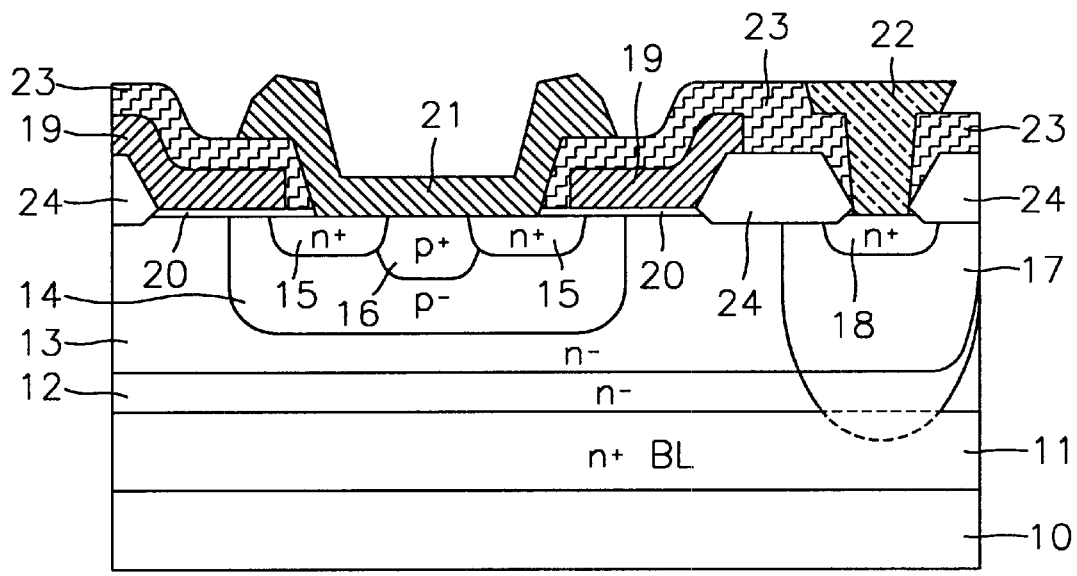
FIG. 2 is a sectional view of the power MOS transistor of FIG. 1 taken along the line I—I.
Figure 3:
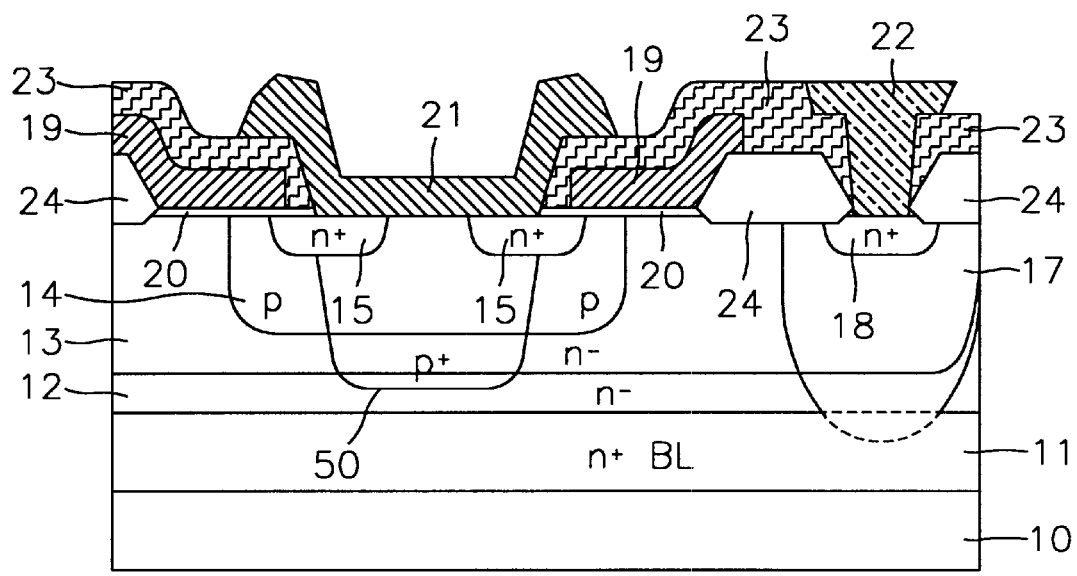
FIG. 3 is a sectional view of a conventional power MOS transistor for suppressing turn-on of a parasitic bipolar transistor.
Figure 4:
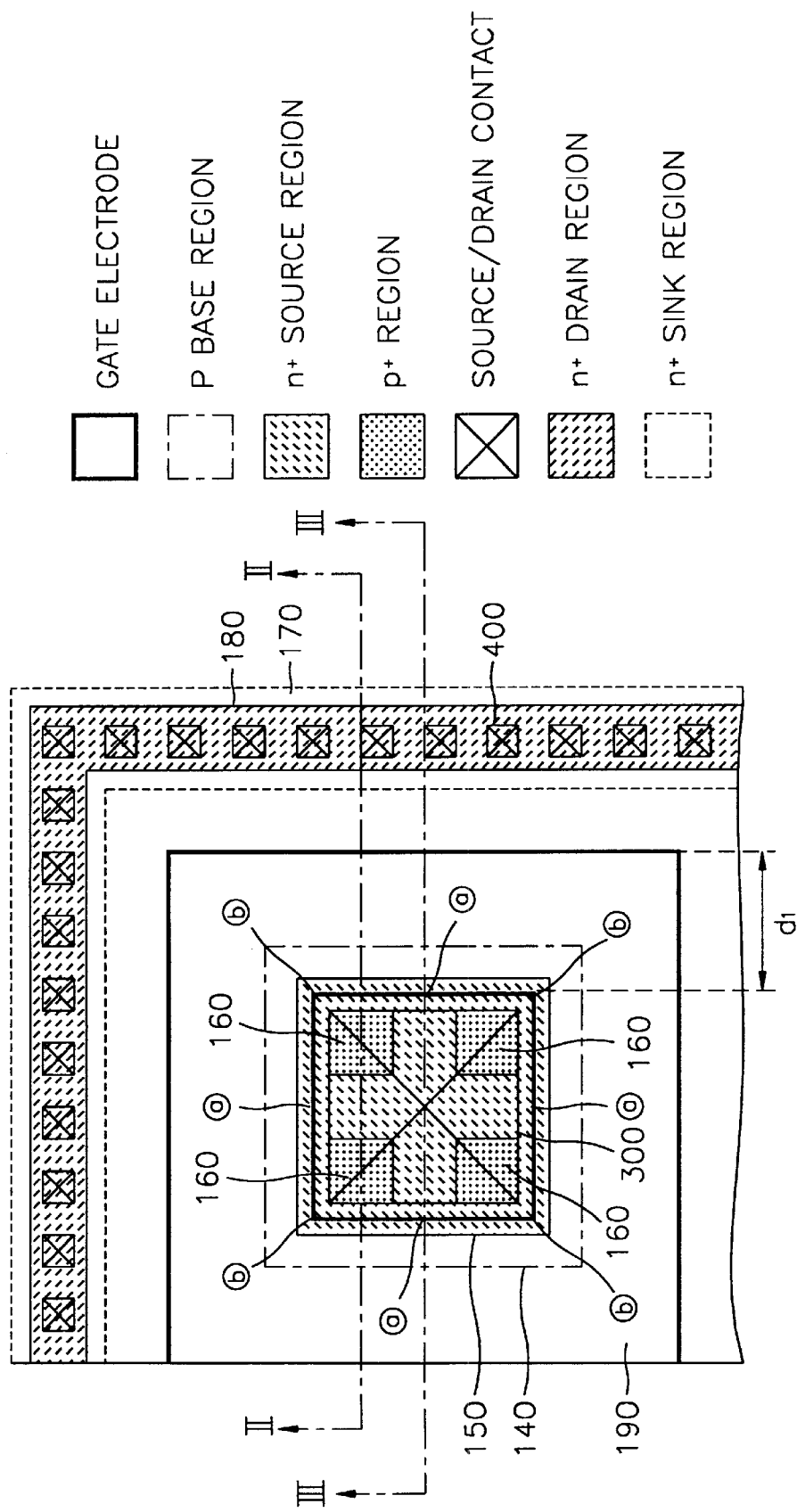
FIG. 4 is a layout of a power MOS transistor according to the present invention.

Referring to FIG. 4, a source contact 300 is formed inside a gate electrode loop 190 having a predetermined width d1 formed on a semiconductor substrate, and multiple drain contacts 400 are formed outside the gate electrode loop 190. A p-type body region 140 is formed in the substrate such that its edge is overlapped by the gate electrode loop 190.

A source region 150 of heavy doping is formed in a predetermined region of the p-type body region 140. The source region 150 includes a loop region (first source region) around the source contact 300 from a portion adjacent to a channel formation region of the p-type body region 140 and a striped cross region (second source region) in which facing portions of the first source region are connected to each other. A p-type heavily-doped region 160 is formed between the first source region and the second source region. Preferably, the p-type heavily-doped regions 160 are symmetrically formed in a corner of the source contact 300.

An n-type heavily-doped drain region 180 is formed under the drain contacts 400, and the n-type heavily doped drain region 180 is completely surrounded with an n-type heavily-doped sink region 170.

Figure 5:
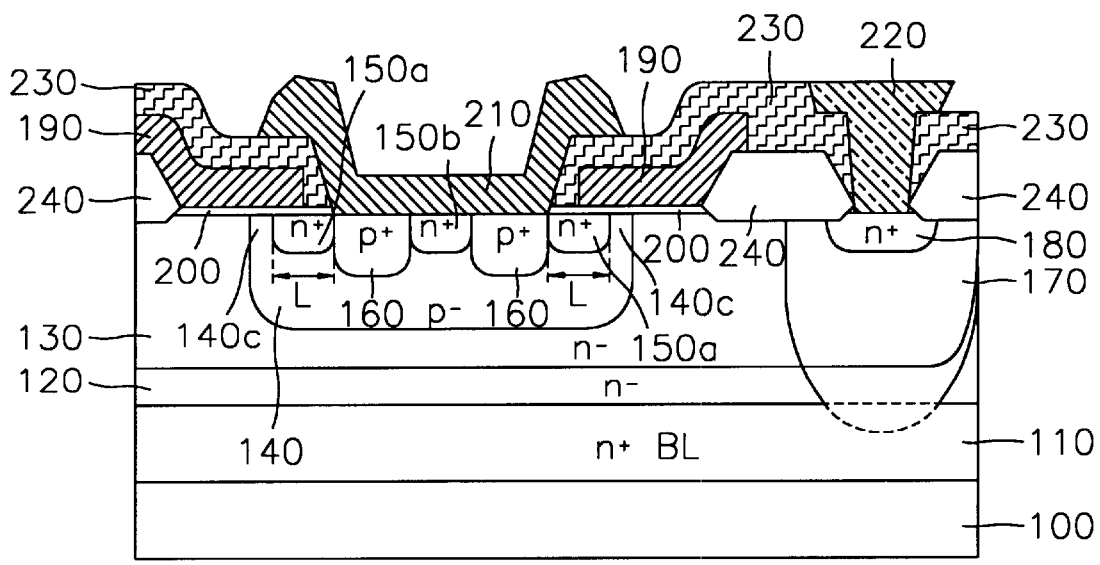
FIG. 5 is a sectional view of the power MOS transistor of FIG. 4 taken along line II—II.
Figure 6:
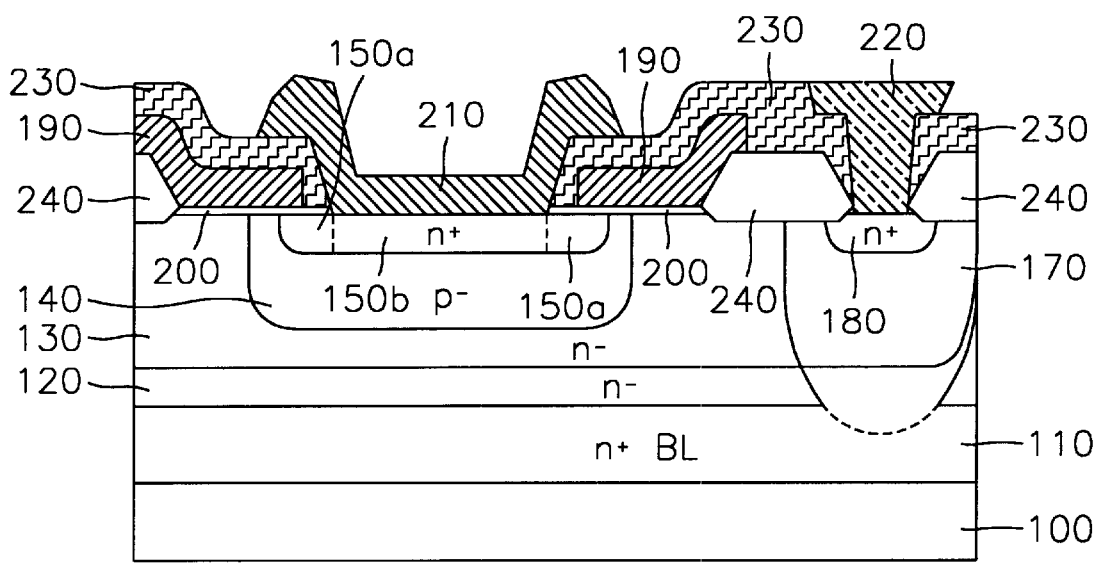
FIG. 6 is a sectional view of the power MOS transistor of FIG. 4 taken along line III—III.

Referring to FIGS. 5 and 6, an n-type buried layer 110 is formed on a semiconductor substrate 100, and an n-type lightly-doped epitaxial layer 120 is formed on the n-type buried layer 110. Also, an n-type well region 130 is formed on the n-type lightly doped epitaxial layer 120, a p-type body region 140 is formed in a predetermined region of the n-type well region 130, and the first and second n-type heavily-doped source regions, respectively 150a and 150b, and a p-type heavily-doped region 160 are formed in a predetermined region of the p-type body region 140. An n-type heavily-doped sink region 170 is formed in another region of the n-type well region 130, and the lower end of the n-type heavily-doped sink region 170 overlaps with a region of the top of the n-type buried layer 110. An n-type heavily-doped drain region 180 is formed in the top of the n-type heavily-doped sink region 170.

Meanwhile, parts of the second n-type heavily-doped source regions 150b and the p-type heavily-doped region 160 contact a source electrode 210, and the n-type heavily-doped drain region 180 contacts the drain electrode 220. The gate electrode loop 190 is connected to the first n-type heavily-doped source regions 150a and part of the p-type body region 140 through a gate insulating layer 200 to thereby form a conductive channel under predetermined conditions. Electrodes are insulated from each other by an insulating layer 230, and an active region is defined by a field oxide layer 240.

In part of the p-type body region 140, the first and second n-type heavily-doped source regions 150a and 150b and the p-type heavily-doped region 160 are alternately formed (see FIG. 5), and in part thereof, the first and second n-type heavily-doped source regions 150a and 150b are formed (see FIG. 6). As shown in FIG. 5, the p-type heavily-doped region 160 is formed between the first n-type heavily-doped source regions 150a, which are formed around the source contact and adjacent to a channel formation region 140c of the p-type body region 140, and the second n-type heavily-doped source region 150b. Thus, the length L of the first n-type heavily-doped source 150a adjacent to the channel formation region 140c is reduced. As shown in FIG. 6, the first n-type heavily-doped source region 150a and the second n-type heavily-doped source region 150b connecting the first source regions facing each other are stripe-formed, where the p-type heavily-doped region does not appear.

The first n-type heavily-doped source region 150a does not contact the source contact, so that current flows to and from the source electrode 210 through the second n-type heavily-doped source region 150b. Thus, as a carrier movement path in the source region is lengthened, resistance components are increased. When the reverse current flows to the source electrode 210 through the p-type heavily-doped region 160, the p-type heavily-doped region 160 is increased so that large reverse current flows to the source electrode 210, to thereby increase the ruggedness of the device. Also, as the length of the first n-type heavily-doped source region 150a is reduced, the amount of voltage drop generated by the reverse current passing through a p-type body region 140 near the bottom of the first n-type heavily-doped source region 150a is reduced, and thus turn-on of the parasitic bipolar transistor can be suppressed.

Meanwhile, as shown in region a of FIG. 4, in a region which is near to the second n-type heavily-doped source region 150b of FIG. 6 and is far from the p-type heavily-doped region 160, the resistance value of the first n-type heavily-doped source region 150a of FIG. 6 is reduced, however, the resistance value of the p-type body region 140 near the bottom of the first n-type heavily-doped source region 150a of FIG. 6 is increased. But, as shown in region b of FIG. 4, in a region which is near the p-type heavily-doped region 160 and far from the second n-type heavily-doped source region 150b of FIG. 5, the resistance value of the p-type body region 140 near the bottom of the first n-type heavily-doped source region 150a of FIG. 5 is reduced. Thus, the resistance values of each portion are balanced, so that current uniformly flows.

What is claimed is:

1. A power MOS transistor comprising:

a drift region of a first conductivity type formed on a semiconductor substrate;

a body region of a second conductivity type formed in a predetermined upper region of the drift region;

a source region of the first conductivity type including a first source region formed in the body region, adjacent to channel formation portions of the body region, and a second source region connecting opposing portions of the first source region;

a plurality of heavily-doped regions of the second conductivity type formed between the first source region in the body region and the second source region;

a drain region of the first conductivity type formed in a predetermined region of the drift region;

an insulating layer formed over the first source region and the edge of the body region;

a gate electrode formed over the insulating layer;

a source electrode formed by a source contact exposing the second source region and the heavily-doped region of the second conductivity type; and a drain electrode formed by a drain contact exposing the drain region.

2. The power MOS transistor of claim 1, wherein the second source region is formed in the shape of a cross which intersects at the center of the source contact.

3. The power MOS transistor of claim 1, wherein the heavily-doped regions of the second conductivity type are symmetrically formed at an edge of source contact.

4. The power MOS transistor of claim 1, wherein the first conductivity type is an n-type and the second conductivity type is p-type.

* * * * *